United States Patent [19]

Pascucci et al.

[11] Patent Number: 5,282,169
[45] Date of Patent: Jan. 25, 1994

[54] COMPENSATED SENSE CIRCUIT FOR STORAGE DEVICES

[75] Inventors: Luigi Pascucci, Sesto S. Giovanni; Marco Olivo, Bergamo, both of Italy

[73] Assignee: SGS-Thomson Microelectronics, S.R.L., Agrate Brianza, Italy

[21] Appl. No.: 791,973

[22] Filed: Nov. 13, 1991

[30] Foreign Application Priority Data

Nov. 19, 1990 [EP] European Pat. Off. ........ 90830529.5

[51] Int. Cl.⁵ .......................................... G11C 11/413
[52] U.S. Cl. ..................... 365/210; 365/208
[58] Field of Search ................................. 365/210, 208

[56] References Cited

U.S. PATENT DOCUMENTS

| | | | |
|---|---|---|---|
| 5,040,148 | 8/1991 | Nakai et al. | 365/210 X |
| 5,148,063 | 9/1992 | Hotta | 365/210 X |
| 5,148,397 | 9/1992 | Kokubun | 365/210 X |
| 5,157,626 | 10/1992 | Watanabe | 365/210 X |

FOREIGN PATENT DOCUMENTS

A347935 6/1989 European Pat. Off. .

Primary Examiner—Eugene R. LaRoche
Assistant Examiner—Do Hyun Yoo

[57] ABSTRACT

The sense circuit recognizes the virgin or programmed status of cells in storage devices (e.g. non-volatile memories of the type with unbalanced loads), and includes a sense amplifier (SA) having a first input (Y) connected to a number of selectable virgin reference cells ($T_{vr1}$, $T_{vr2}$) and a second input (X) connected to a number of selectable matrix cells ($T_{vm}$, $T_{pm}$). According to the invention, the current path of a compensatory programmed cell (NP) is connected between a reference voltage and the first input (Y) of the sense amplifier (SA), with the gate of the compensatory programmed cell being connected to a voltage source ($V_s$) which selects the compensatory programmed cell at least while the sense amplifier reads a selected matrix cell.

21 Claims, 1 Drawing Sheet

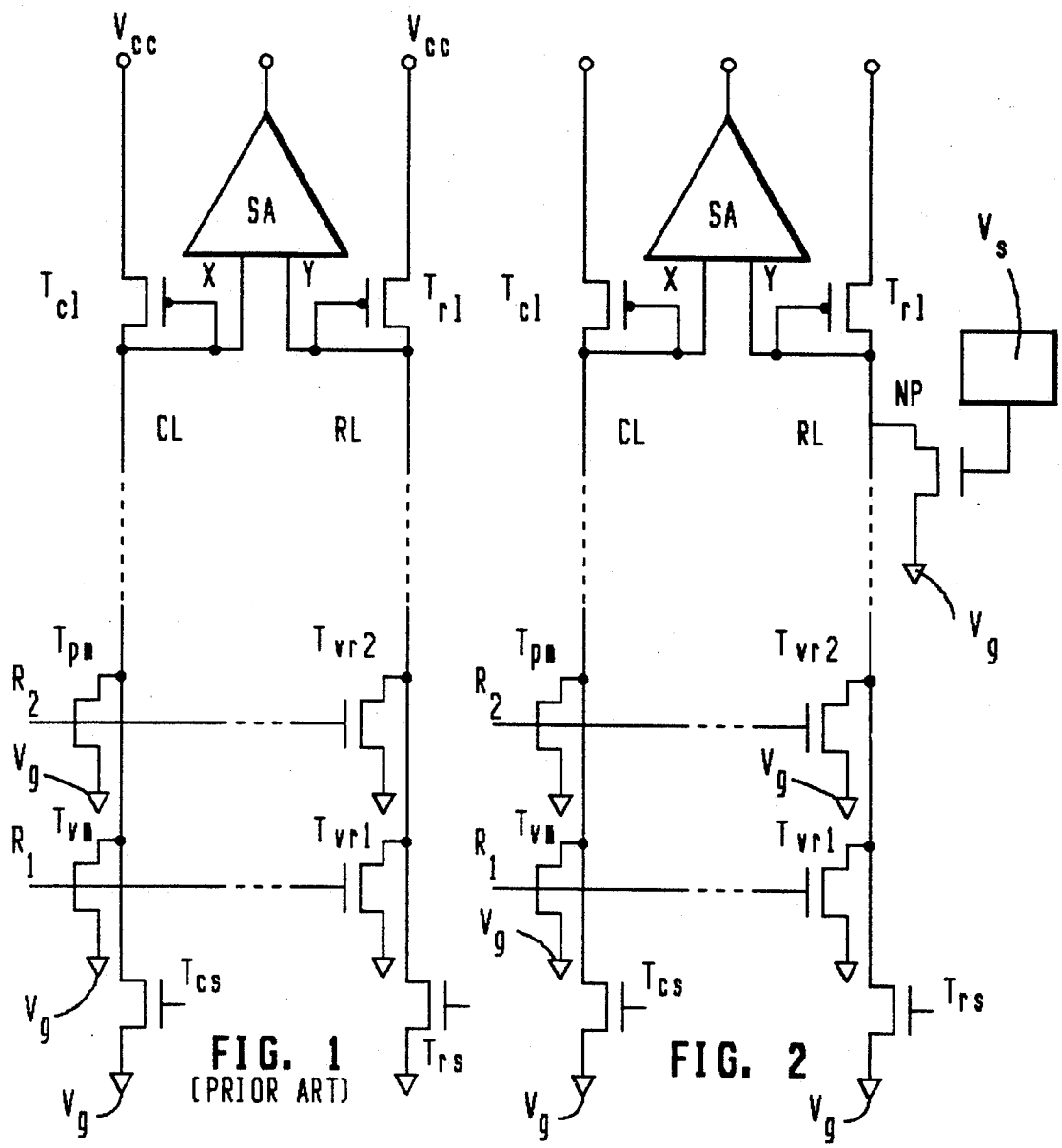
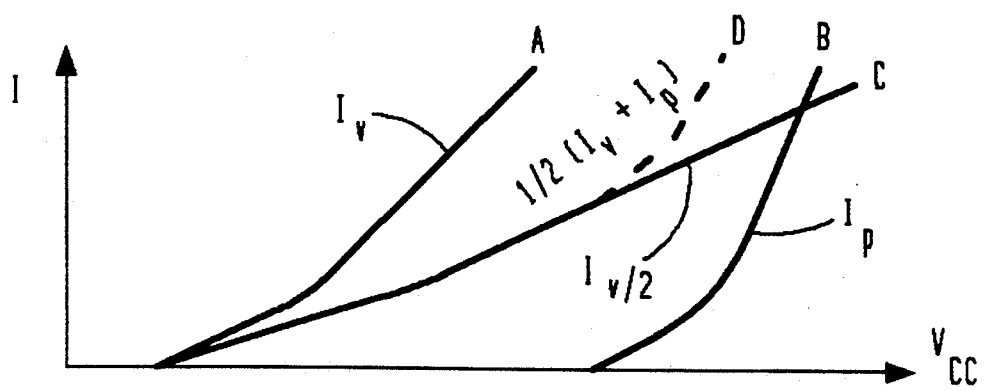
FIG. 3

COMPENSATED SENSE CIRCUIT FOR STORAGE DEVICES

FIELD OF THE INVENTION

This invention is concerned with an improved sense circuit, of the type with unbalanced loads, for distinguishing between a virgin status and a programmed status of a cell in a storage device, e.g., a CMOS non-volatile memory.

BACKGROUND OF THE INVENTION

In circuits made with CMOS technology, where programmable components are used to make non-volatile memories (e.g., ROM, EPROM, EEPROM, FLASH), it is necessary to provide a reference system which is able to distinguish between programmed elements (which are turned off) and non-programmed, or virgin, elements (which are turned on). The differentiation can be achieved by comparing the current $I_{vr}$ in a virgin reference cell with the current in the matrix element or cell which it is desired to read. The latter current will ideally be zero for a programmed cell ($I_{pm}$), and non-zero for a virgin cell ($I_{vm}$). In order to have a balanced comparison wherein the discrimination value lies at the middle between $I_{vm}$ and $I_{pm}$, it is known to shift the threshold by using differently sized loads for the matrix cell and the reference cell. This is known as reading with "unbalanced loads".

However, as will become more evident from the following, disclosure, for extreme values of parameters, such as various tolerances in the manufacturing process or of the supply voltage (particularly for an unusually high supply voltage), the current $I_{pm}$ in the programmed cell may depart from zero to such an extent that the comparison fails, and a programmed cell will be misread as virgin, or vice versa. This situation effectively limits the maximum range of acceptable supply voltages, or, from another point of view, compels the manufacturer to discard devices which would otherwise be satisfactory, because they fail at high supply voltages.

SUMMARY OF THE INVENTION

An object of the invention is therefore to provide an improved sense circuit, of the type with unbalanced loads, for recognizing the virgin or programmed status of the cells in storage devices, e.g., non-volatile memories, wherein the sense circuit compensates the above drift of $I_{pm}$ from zero and extends the operating range of the sense circuit, particularly in that it allows operation with higher supply voltages.

Another object is to increase the yield of such sense devices in the manufacturing process.

The invention achieves the above and other objects and advantages, such as will appear from the following disclosure, with an improved sense circuit for recognizing is the virgin or programmed status of cells in storage devices such as non-volatile memories, wherein the sense circuit is preferably of the type with unbalanced loads and comprises a sense amplifier having a first input connected to a number of selectable virgin reference cells, and a second input connected to a number of selectable matrix cells, and a compensatory programmed cell connected to the first input of the sense amplifier. In a specific embodiment, the compensatory programmed cell is connected with its source to ground, with its drain to the first input of the sense amplifier, and with its gate to a voltage source which is high at least while the sense amplifier reads a selected matrix cell.

BRIEF DESCRIPTION OF THE DRAWINGS

The invention will now be described in more detail with reference to a preferred embodiment, given by way of illustrative and nonlimiting example, and with the aid of the attached drawings, wherein:

FIG. 1 is a diagram of a storage device having an unbalanced-load sense circuit according to the prior art;

FIG. 2 is a diagram of a storage device having an unbalanced-load sense circuit according to the invention; and FIG. 3 is a current-voltage plot showing various current quantities plotted against an increasing supply voltage for the circuits of FIGS. 1 and 2.

DETAILED DESCRIPTION

FIG. I shows a storage device having a conventional sense circuit using the approach of "unbalanced loads". Cell $T_{vm}$ is a virgin cell, cell $T_{pm}$ is a programmed cell, and they are associated with a common column line CL and respective row lines $R_1$ and $R_2$. These cells are part of a matrix of cells or transistors of a storage device (not shown fully), having a plurality of column lines and a plurality of row lines. Examples of suitable storage devices include ROM, EPROM, EEPROM, FLASH, etc. The storage device is preferably made with CMOS technology. Each of the column lines is connected to a plurality of matrix cells, while each of the row lines is also connected to a plurality of matrix cells. The selection of a particular column line is and a particular row line results in the selection of one particular matrix call in the matrix.

Each of the cells $T_{vm}$ and $T_{pm}$ has a current path connected between the associated column line CL and a reference voltage $V_g$, and a gate connected to the respective associated row line. In the specific embodiment of FIG. 1, cell $T_{vm}$ has a grounded source, a drain connected to a column line CL, and a gate connected to a row line $R_1$, while cell $T_{pm}$ has a grounded source, a drain connected to column line CL, and a gate connected to row line $R_2$. Column line CL, the current path of its associated P type load transistor $T_{CL}$, and the current path of a column selection transistor $T_{cs}$ are connected in series between a first reference voltage (supply voltage $V_{cc}$) and a second reference voltage (reference ground voltage $V_g$). The column line CL is also connected to the gate of load transistor $T_{CL}$ and to input X of the sense differential amplifier SA.

Each column line is provided with a column selection transistor, a load transistor and a sense amplifier. Each of the column selection transistors can be selectively turned on by the application of a selection signal to the gate of the respective column selection transistor to activate the associated column line, and each of the row lines can be selectively driven high by means (not shown), as is well known in the art, to select the cell at the crosspoint of the selected column and the selected row. If the selected matrix cell is virgin, such as Tvm, a current $I_{vm}$ is caused to flow through it, while, if the selected call is programmed, such as $T_{pm}$, an ideally null current $I_{pm}$ will be caused to flow through it.

Transistors $T_{vr1}$ and $T_{vr2}$ are two virgin reference cells, corresponding to matrix cells $T_{vm}$ and $T_{pm}$, respectively. Each of these virgin reference calls has its current path connected between a reference column line RL and a reference voltage, with its gate connected to the respective associated row line. In the illustrated embodiment, each of the virgin reference cells has its source connected to reference ground and its drain connected to reference line RL. The gate of reference cell $T_{vr1}$ is connected to row line $R_1$, while the gate of reference cell $T_{vr2}$ is connected to row line $R_2$.

The reference column line RL, its associated P type load transistor $T_{RL}$ and a reference column selection transistor $T_{RS}$ are connected in series between the supply voltage $V_{cc}$ and the reference voltage $V_g$. The reference line RL is also connected to the gate of load transistor $T_{RL}$ and to input Y of sense amplifier SA.

The reference column and transistor $T_{RL}$ can be turned on, simultaneously with column line CL, by the application of a selection signal to the gate of transistor $T_{RS}$ and to the gate of transistor $T_{cs}$. As is known in the art, there is a virgin reference cell for each row of matrix cells in the device.

As a rule, a virgin matrix cell and a virgin reference cell are the same, structurally, so that under the same supply voltage and load conditions the current $I_{vm}$ through the virgin matrix cell would equal the current $I_{vr}$ through the virgin reference cell. In other words, $I_{vm} = I_{vr} = I_v$ under the same supply voltage and load conditions.

However, as is known in the art, in order to provide the unbalanced load condition, load transistors $T_{CL}$ and $T_{RL}$ are made to be different, usually by making the reference load transistor $T_{RL}$ twice as large as the matrix load transistor $T_{CL}$, so that, in the ideal two-to-one unbalanced situation, the current through a virgin matrix cell is about half the current through the virgin reference cell. In other words, in this unbalanced situation, $I_{vm} = I_{vr}/2$. This results in different voltages at inputs X and Y of the sense amplifier SA even though the selected matrix cell and the reference cell are both virgin cells. This allows the is sense amplifier SA to give an appropriate output when reading a virgin matrix cell.

When the virgin matrix cell $T_{vm}$ is selected in the two-to-one unbalanced sense circuit, sense amplifier SA will then compare a current $I_{vr}(=2I_{vm})$ flowing in reference line RL with a current $I_{vm}$ flowing in column line CL. When the programmed matrix cell $T_{pm}$ is selected, a current $I_{pm}$ will flow in column line CL. Ideally, the current in a programmed cell is zero, i.e., $I_{pm}=0$. Then the following relations would hold when reading a virgin or a programmed cell, respectively, under ideal conditions in the two-to-one unbalanced sense circuit:

$$I_{vr} > I_{vm}, \text{ or } 2I_{vm} > I_{vm}, \text{ or } I_{vm} > I_{vm}/2 \quad (1)$$

$$I_{pm} < I_{vm}/2, \text{ or } 0 < I_{vm}/2 \quad (2)$$

The current value $I_{vm}/2$ is therefore the tripping value, causing the sense amplifier SA to switch from an output indicating a programmed cell to an output indicating a virgin cell, or vice versa. This will be further discussed below with reference to FIG. 3.

Inequalities (1) and (2) are inherently true for ideal conditions. However, in actual devices, and for extreme ranges in the process parameters, in the supply voltage, in the temperature, etc., it may well happen that the current $I_{pm}$ in the programmed matrix call is different from zero, and the above inequalities (1) and (2) must be replaced by:

$$I_{vm} > I_{vm}/2, \text{ or } I_{vm} > I_v/2 \quad (3)$$

$$I_{pm} < I_{vm}/2, \text{ or } I_{pm} < I_v/2 \quad (4)$$

Whenever $I_{pm}$ departs from zero and/or $I_v$ decays from its rated value enough for $I_{pm}$ to approach half the value of $I_v$, the recognition process will break down, and a programmed cell may be read as virgin, or vice versa. In particular, this is bound to happen at very high supply voltages, and effectively limits the range of acceptable operating values of the supply voltage for given tolerances in the process parameters. From another point of view, the limitation imposed by inequality (4) compels the manufacturer to reject a high number of devices which would otherwise be satisfactory.

The above situation can be better understood from the diagram of FIG. 31 where the lines show how the values of several current quantities of interest at a given load condition change as the supply voltage $V_{cc}$ increases from zero volts. Line A shows the current $I_v$ in a virgin cell; line B shows the current $I_p$ in a programmed cell; and line C shows the current $I_v/2$, i.e., the threshold current level discriminating between a decision for a virgin cell and a decision for a programmed cell in the sense amplifier of FIG. 1. (The dashed line D will be explained later.) However, while the current $I_p$ is substantially zero over the greater part of the supply voltage range, it assumes non-zero values at the high end of the range. While at moderate supply voltages the threshold is halfway between $I_p$ and $I_v$ at high supply voltages the threshold line C crosses line B due to the smaller slope of line C, thus causing the recognition process to fail. With reference to FIG. 2, an improved sense circuit according to the invention will now be described. The sense circuit is similar to the circuit of FIG. 1, and includes all the parts shown there, which are referenced by the same reference characters also in FIG. 2. However, the circuit of FIG. 2 also comprises an compensatory programmed transistor NP having its current path connected between the input Y of the sense amplifier SA and the reference voltage $V_g$, and its gate connected to voltage source $V_s$. In the illustrated embodiment, transistor NP is an N type transistor with its source being grounded, while its drain is connected to the reference line RL and the input Y of the sense amplifier SA. The voltage source $V_s$ drives the gate of transistor NP high, at least during the time a matrix cell is being read. The compensatory programmed cell NP is preferably permanently selected. The voltage source $V_s$ is also preferably chosen to coincide with the supply voltage $V_{cc}$.

The sense circuit will compare (a) a function of the sum of the current through the selected virgin reference call and the current through the compensating programmed cell with (b) a function of the current through the selected matrix cell. With the sense circuit of FIG. 2, the sense amplifier SA will compare a current ($I_{vr} + I_{np}$) with either a current $I_v$ (if a virgin matrix cell was selected) or a current $I_p$ (if a programmed matrix cell was selected), taking into account the unbalanced loading.

In other words, the set of inequalities (3) and (4) is now replaced by the following inequalities:

$$I_{vm} > (I_v + I_p)/2 \quad (5)$$

$$I_{pm} < (I_v + I_p)/2 \quad (6)$$

where, again, the virgin matrix cell and the virgin reference cell are the same, i.e., $I_{vm}=I_{vr}=I_v$ under the same supply voltage and load conditions. Also, $I_{pm}=I_{pm}=I_{np}$ under the same supply voltage and load conditions, and $I_{pm}=I_{np}/2$ under the conditions of the two-to-one unbalanced load sense circuit. Then, even if $I_p>0$, the above inequalities become:

$$I_v>I_p \qquad (7)$$

$$I_p<I_v \qquad (8)$$

Since the current in a virgin cell, even in extreme situations, must always be greater than the current in a program-med cell, unless the cell has utterly broken down, inequalities (7) and (8) must always be true. Therefore the sense circuit of FIG. 2 provides for correct recognition of the status of matrix cells even at extreme ranges of the parameters, or for highly deteriorated conditions of the cells.

The new situation is reflected in the dashed line D in FIG. 3, which represents how the quantity $(I_v+I_p)/2$ changes with increasing supply voltage $V_{cc}$. It can be appreciated that line D stays equidistant from lines A and B over a greater range of the supply voltage $V_{cc}$ than does line C, which represents the value of $I_v/2$.

A preferred embodiment of the invention has been disclosed above, but it is understood that changes within the scope of the invention may be made to it by the person skilled in the art. For example, the transistors can be replaced with transistors having opposite type of conductivity. In particular, while the voltage biasing the gate of the compensatory programmed cell has been described as coinciding with the supply voltage, a value less than the supply voltage can be utilized to achieve the objects of the invention. Moreover, although the word "programmed" used above suggests that programmation has been achieved by application of electrical biases, it should be understood to also cover programmation achieved by means of masks during the manufacturing process, e.g., in the production of ROMS. While the invention has been illustrated in terms of a reference column line RL having a virgin reference cell in each row of the matrix, it is within the scope of the invention to utilize a reference row having a virgin reference cell in each column of the matrix. Thus, a matrix line can be a column of matrix cells, as illustrated in FIG. 2, or a row of matrix cells.

What is claimed is:

1. A floating-gate memory device, comprising:
    a sense amplifier having a first input and a second input;
    a plurality of selectable virgin reference cells connected to said first input of said sense amplifier;
    a plurality of selectable matrix cells connected to said second input of said sense amplifier;
    a compensatory programmed transistor having a current path and a gate, the current path of said compensatory programmed transistor being connected between said first input of said sense amplifier and a reference voltage source; and
    a high voltage source connected to said gate of said compensatory programmed transistor such that said compensatory programmed transistor is selected during at least the time while said sense amplifier reads a selected one of said plurality of selectable matrix cells.

2. A memory device in accordance with claim 1 wherein said memory device is of the type having unbalanced loads.

3. A memory device in accordance with claim 1, further comprising a first load transistor in series with said first input of said sense amplifier, and a second load transistor in series with said second input of said sense amplifier; and wherein said first load transistor is approximately twice as large as said second load transistor.

4. A memory device in accordance with claim 1 wherein said memory device is a non-volatile memory.

5. A memory device in accordance with claim 4 wherein said non-volatile memory is made with CMOS technology.

6. A memory device in accordance with claim 1 further comprising a supply voltage source; first and second load transistors, the sizes of said first and second load transistors being different from each other, each of said first and second load transistors having a current path and a gate; a reference line; a matrix line; the current path of said first load transistor and said reference line being connected between said reference voltage source and said supply voltage source, wherein said plurality of selectable virgin reference cells are connected through said reference line to said first input of said sense amplifier; the current path of said second load transistor and said matrix line being connected between said reference voltage source and said supply voltage source, wherein said plurality of selectable matrix cells are connected through said matrix line to said second input of said sense amplifier.

7. A memory device in accordance with claim 6 wherein the gate of said first load transistor is connected to said first input of said sense amplifier, and wherein the gate of said second load transistor is connected to said second gate of said sense amplifier.

8. A memory device in accordance with claim 6 wherein said memory device comprises said plurality of matrix cells arranged in a plurality of columns of matrix cells and a plurality of rows of matrix cells to form a matrix, and wherein said matrix line is one of said columns.

9. A memory device in accordance with claim 8 wherein said plurality of selectable virgin reference cells contains a selectable virgin reference cell for each of said rows of matrix cells.

10. A memory device in accordance with claim 6 wherein each of said plurality of selectable virgin reference cells has a source and a drain, with the source of each of said plurality of selectable virgin reference cells being connected to said reference voltage source and the drain of each of said plurality of selectable virgin reference cells being connected to said reference line, and wherein each of said plurality of selectable matrix cells has a source and a drain, with the source of each of said plurality of selectable matrix cells being connected to said reference voltage source and the drain of each of said plurality of selectable matrix cells being connected to said matrix line.

11. A memory device in accordance with claim 10 wherein said compensatory programmed transistor has a source and a drain, with the source of said compensatory programmed transistor being connected to said reference voltage source and the drain of said compensatory programmed transistor being connected to said reference line.

12. A memory device in accordance with claim 11 wherein the current path of said first load transistor is connected between said supply voltage source and said first input of said sense amplifier, and wherein the current path of said second load transistor is connected between said supply voltage source and said second input of said sense amplifier.

13. A memory device in accordance with claim 12 wherein said high voltage source is said supply voltage source.

14. A memory device in accordance with claim 13 wherein said storage device is a non-volatile memory.

15. A memory device in accordance with claim 14 wherein said non-volatile memory is made with CMOS technology.

16. A memory device in accordance with claim 15 wherein said first load transistor is approximately twice as large as said second load transistor.

17. A memory device in accordance with claim 16 wherein the gate of said first load transistor is connected to said first input of said sense amplifier, and wherein the gate of said second load transistor is connected to said second input of said sense amplifier.

18. A memory device in accordance with claim 17 wherein said memory device comprises said plurality of matrix cells arranged in a plurality of columns of matrix cells and a plurality of rows of matrix cells to form a matrix, and wherein said matrix line is one of said columns.

19. A process for recognizing, a virgin or programmed status of cells in storage devices, comprising:
  selecting a matrix cell and a virgin reference cell,
  passing a current through the thus selected virgin reference cell and a first load,
  passing a current through the thus selected matrix cell and a second load, the size of said second load being different from the size of said first load,
  passing a current through a compensating programmed cell,
  comparing (a) a function of the sum of aid current through said thus selected virgin reference ell and said current through said compensating programmed cell with (b) a function of the current through said thus selected matrix cell.

20. A process in accordance with claim 19 wherein said first and second loads are transistors, with the size of said first transistor being approximately twice the size of said second transistor, wherein said function of the sum can be represented by $(I_v+I_p)/2$, where $I_v$ is the current through a virgin matrix cell and $I_p$ is the current through a programmed matrix cell, wherein said function of said current through said thus selected matrix cell can be represented by $I_v$ if said thus selected matrix cell is a virgin matrix cell, and wherein said current through said thus selected matrix cell can be represented by $I_p$ if said thus selected matrix cell is a programmed matrix cell.

21. A floating-gate memory device, comprising:
  a sense amplifier having a first input and a second input;
  a plurality of selectable virgin reference cells connected to said first input of said sense amplifier;
  a compensatory programmed transistor having a gate operatively connected to a power supply voltage, and a source operatively connected to ground, and a drain operatively connect to said first input of said sense amplifier at least during read mode; and
  a plurality of selectable matrix cells connected to said second input of said sense amplifier;
  whereby said compensatory programmed transistor and said virgin reference cells jointly provide a compensated reference current, for said sense amplifier, which remains intermediate between the current drawn by a virgin matrix cell and a programmed matrix cell even at high values of the supply voltage.

* * * * *

UNITED STATES PATENT AND TRADEMARK OFFICE
CERTIFICATE OF CORRECTION

PATENT NO. : 5,282,169
DATED : January 25, 1994
INVENTOR(S) : Pascucci et al.

It is certified that error appears in the above-identified patent and that said Letters Patent is hereby corrected as shown below:

In column 8, line 4, please change "ell" to -cell-.

Also in column 8, line 3, change "aid" to -said-.

Signed and Sealed this

Thirty-first Day of October 1995

Attest:

BRUCE LEHMAN

*Attesting Officer*     *Commissioner of Patents and Trademarks*